(12) United States Patent
Liao

(10) Patent No.: US 6,174,753 B1
(45) Date of Patent: Jan. 16, 2001

(54) MASK REDUCTION PROCESS WITH A METHOD OF FORMING A RAISED FUSE AND A FUSE WINDOW WITH SIDEWALL PASSIVATION

(75) Inventor: Wen-Shiang Liao, Miao Li (TW)

(73) Assignee: Vanguard International Semiconductor Corporation, Hsinchu (TW)

(*) Notice: Under 35 U.S.C. 154(b), the term of this patent shall be extended for 0 days.

(21) Appl. No.: 09/252,187

(22) Filed: Feb. 18, 1999

(51) Int. Cl.[7] .................................................. H01L 21/82
(52) U.S. Cl. ................... 438/132; 438/601; 148/DIG. 55
(58) Field of Search ..................................... 438/131, 132, 438/600, 601, 639; 148/DIG. 55

(56) References Cited

U.S. PATENT DOCUMENTS

| | | | |
|---|---|---|---|
| 5,578,517 | * | 11/1996 | Yoo et al. ............................. 438/601 |
| 5,753,539 | * | 5/1998 | Okazaki ............................... 438/132 |
| 5,930,664 | * | 7/1999 | Hsu et al. ............................. 438/612 |
| 5,965,927 | * | 10/1999 | Lee et al. ............................. 438/132 |
| 6,004,834 | * | 12/1999 | Tsukude et al. ..................... 438/601 |
| 6,096,579 | * | 8/2000 | Liao et al. ........................... 438/131 |

* cited by examiner

*Primary Examiner*—Kevin M. Picardat
(74) *Attorney, Agent, or Firm*—Christensen O'Connor Johnson PLLC

(57) ABSTRACT

The present invention discloses a mask reduction process to reduce the number of mask processes employed in the post-process of metal line formation. A fuse window opening can be formed together with the defining of contact holes. A pad opening can also be formed at the same time with the etching of a fuse window. With the process integration proposed in the present invention, a raised fuse and a fuse window with sidewall passivation can be formed.

22 Claims, 5 Drawing Sheets

MASK REDUCTION PROCESS WITH A METHOD OF FORMING A RAISED FUSE AND A FUSE WINDOW WITH SIDEWALL PASSIVATION

CROSS REFERENCE TO RELATED APPLICATIONS

This invention is related to co-filed U.S. Patent application entitled "Mask Reduction Process with a Method of Forming an Embedded Fuse and a Fuse Window with Sidewall Passivation" assigned to same assignee with a common inventor as the present application and incorporated herein by reference in their entirety.

FIELD OF THE INVENTION

The present invention relates to semiconductor fabrication processes, and more specifically, to a mask reduction process with a method of forming a raised fuse and a fuse window with sidewall passivation.

BACKGROUND OF THE INVENTION

The design concept of making redundant cells or circuits to replace defective ones is of vital application in the fabrication of integrated circuits. Defective cells on a chip are usually identified using a chip probe test step after wafer processing. The defective cells can be replaced with redundant cells by the redefinition of connective paths. With such a reworking process to correct fabrication defects, the number of defective cells can be greatly reduced. The use of redundant cells is employed in most memory chips and logic circuit chips to increase the yield and reduce the cost of production.

There are several ways of modifying the connections to substitute redundant cells for defective cells. The use of a fuse is one of the most widely employed methods for swapping defective cells with redundant cells. The replacement of defective cells is achieved by breaking the appropriate fuses on the chip. The conducting paths are then changed to address the defect free redundant cells. Typically, a laser is applied to "blow" the fuse with the predetermined address code.

Taking a DRAM memory array as an example, one or more spare rows and columns are formed outside or around the designed memory array. In general, fuse connections are formed with the poly-1 (the first polysilicon layer) and poly-2 (the second polysilicon layer) of the interconnection structures. A defective cell with an identified address can be replaced by blowing the corresponding fuse to connect a redundant cell.

Referring to FIG. 1, a fuse window 10 is opened during manufacturing. This is also referred to as the laser window. The fuse window 10 is opened by removing dielectric layers or passivations layers 26, 12, 14, and 16 over the fuse 18 in the manufacturing process. Thus the fuse 18 can be readily reached by the laser beam to blow it out.

For reducing the complicate masking and etching process needed for forming fuse window after the formation of metal lines, a fuse window opening can be modified to be formed simultaneously with the inter-metal contact via holes. However, the formation of fuse window or fuse window opening 10 by removing the dielectric or the passivation layers 26, 12, 14, and 16 may cause some problems. The fuse window 10, which is opened across several layers of dielectric materials, makes the interface regions 10a and 10b between the dielectric or the passivation layers 12, 14, and 16 to be exposed. It has been found that moisture and contamination from outside can enter into the conductive paths 20, 22, and 24 through the interface regions 10a and 10b. The diffused moisture can further reach the elements or connections of the devices on the substrate. By reacting with moisture and contamination, the conductive structures and other elements are corroded to cause functional degradation or damage. The reliability and yield of the products are then decreased.

In the conventional process of forming fuse window, a dielectric layer is left over the fuse 18. The dielectric layer is mostly a transparent oxide layer of several thousand angstrom thickness. During the laser repairing process (the act of blowing the fuses), the fuse 18 is melted and the oxide layer is exploded. A greater energy is required to explode the oxide layer to ensure an exact breakdown of the fuse 18. A laser using a higher energy is harder to control accurately. Additionally, when the fuse is blown, residue from the fuse may leak to surrounding structures and decreases the reliability of the reworking process.

What is needed is a mask reduction process with a method of forming a raised fuse and a fuse window with sidewall passivation. A raised fuse structure that is easily broken is also needed for providing a low energy and easily controlled laser reworking process.

SUMMARY OF THE INVENTION

A method of forming a raised fuse structure with sidewall-protected fuse window on a substrate is disclosed. The method comprises the steps of: removing a portion of said dielectric layers to form an inter-metal contact via hole within said dielectric layers extending down to said first conductive structure and to form simultaneously a fuse opening within said dielectric layers over said fuse; forming a second conductive structure within said inter-metal contact via hole and over said inter-metal contact via hole; forming a passivation layer over said second conductive structure and said fuse opening; and removing a portion of said passivation layer and of said dielectric layers down to at least said fuse for forming said fuse window between a sidewall structures formed on said fuse opening and for leaving an raised fuse structure.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention discloses a mask reduction process to reduce the number of mask processes needed for forming a fuse window after the formation of metal lines. A fuse window opening can be formed together with the defining of inter-metal contact via holes. A bonding pad opening can also be formed at the same time with the etching of a fuse window. Under the control of sidewall steepness in the present invention during the etching process of the fuse window opening, the coating effect of the sidewall passivation is further enhanced. With the process integration proposed in the present invention, a raised fuse and a fuse window with sidewall passivation can be formed. Moisture and contamination are kept from reaching and damaging conductive structures by the protection of sidewall passivation. The raised fuse structure with low blowing energy provides a simpler laser repairing process than the prior art. The reliability and the yield of the process are increased with the sidewall passivation.

Without limiting the scope and the spirit of the present invention, a detailed embodiment of applying the method of the present invention to finish a substrate with a fuse window and two layers of conductive connections is described in detail. The formation of the fuse window is incorporated with the process of making the last conductive connections in a preferred embodiment. Upon acknowledging the disclosed method, a person skilled in the art can apply the method of the present invention to form fuse window with one or more layers of conductive connections. The applications are well known in the art and thus are not illustrated in detail.

Figure 1:
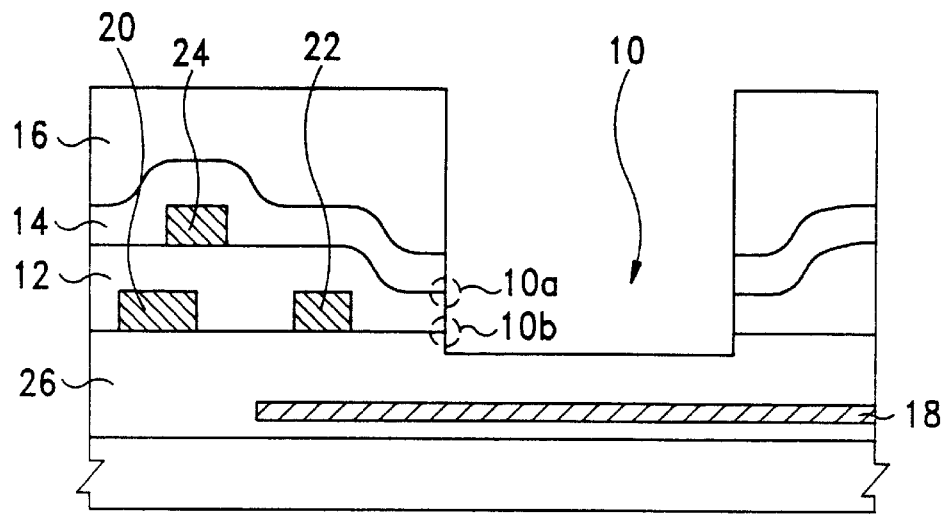
FIG. 1 illustrates a prior art cross sectional view of a semiconductor substrate with a fuse window.
Figure 2:
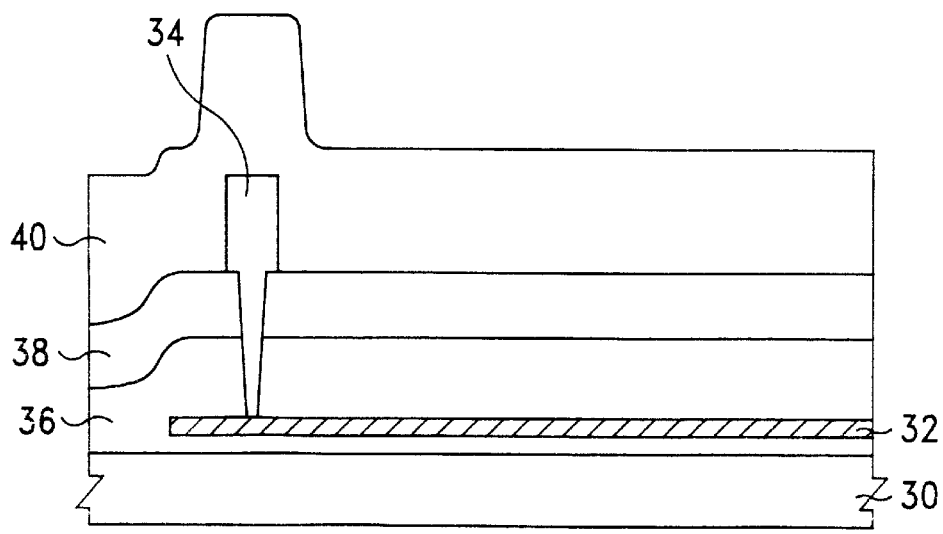
FIG. 2 illustrates a cross sectional view of a semiconductor substrate with a fuse, a first conductive structure and dielectric layers formed in accordance with the present invention.

Turning to FIG. 2, a substrate 30 with a fuse 32, a first conductive structure 34 and dielectric layers 36, 38, and 40 is provided. In general, a silicon substrate with a crystalline direction of <100> is used as the substrate 30. Other kinds of substrate with different crystalline directions and materials can also be used. Generally, there are a great number of fuse members and conductive structures on the substrate 30. Only one fuse member 32 and one first conductive structure 34 is shown for a clear and focused illustration. More layers of conductive structures can also be formed with multilevel interconnections.

The dielectric layers in the described embodiment includes three layers. The first layer is an inter-polysilicon oxide layer 36, the second layer is an interlayer dielectric layer 38, and the third layer is an inter-metal dielectric layer 40. With differing designs of the device and the process, the combination and the number of the dielectric layers can be modified.

Figure 3:
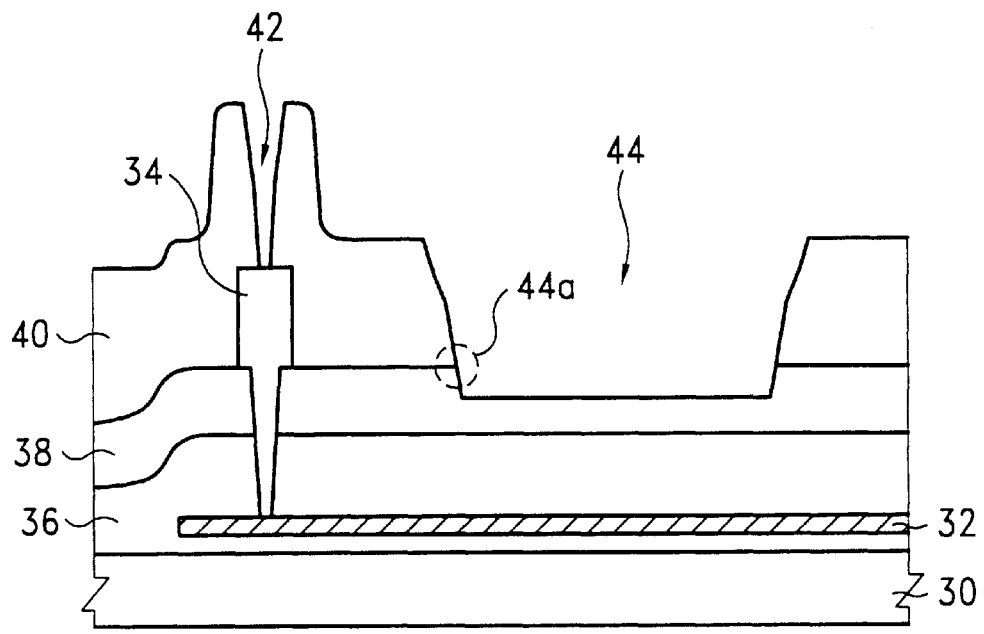
FIG. 3 illustrates a cross sectional view of removing a portion of the dielectric layers to form a via hole and a fuse opening within the dielectric layers in accordance with the present invention.

First, a step of simultaneously forming an internal inter-metal contact via hole 42 and a fuse opening 44 is performed by removing a portion of the dielectric layers 38 and 40, as shown in FIG. 3. The inter-metal contact via hole 42 to the first conductive structure 34 is formed within the dielectric layer 40. The fuse opening 44 is formed within the dielectric layers 40 and 38 over the fuse 32. In this case, a wet etching step followed by a dry etching step is performed to provide the openings 42 and 44 with the shape as shown in FIG. 3. Thus, the intermetal contact via hole 42 has a wider opening on the top portion than its lower portion. In particular, the wider shape at the upper half of the inter-metal contact via hole 42 and the fuse opening 44 are formed by the isotropic wet etching. The only slightly tapered lower half of the inter-metal contact via hole 42 and the fuse opening 44 are formed by the anisotropic dry etching.

However, with the scaling down in the feature size of devices on the integrated circuits, the gap between devices or conductive paths on the substrate 30 is highly limited. A passivation layer for preventing moisture encroachment is formed in a later process. Under the feature size for circuits with high packing density, the thickness of the passivation layer is quite limited. In some occasions, the thickness of the sidewall passivation with an anisotropic deposition process might be limited, especially for a fuse opening with a steep sidewall. For increasing the sidewall thickness of the passivation layer, the process of forming the inter-metal contact via hole 42 and the fuse opening 44 can be adjusted to decrease the tapered angle of the fuse opening sidewall. The processing time of the wet etching is increased to widen the opening on the top portion, the sidewall steepness formed with the subsequent dry etching process is then reduced. As an example, the sidewall inclined angle by referencing to a horizontal surface of the substrate 30 at the lower portion of the fuse opening 44 can be about 50 degrees to about 80 degrees.

The etching process is controlled to make the fuse opening 44 extend across two or more layers of the dielectric layers 36, 38, and 40 in depth. One or more interface regions 44a between the dielectric layers 36, 38, and 40 are thus exposed. As will be seen below, a passivation sidewall is formed to cover the interface region 44a. Since the weakest interface region is typically between the inter-layer dielectric layer 38 and the inter-metal dielectric layer 40, the fuse opening 44 is etched to extend below the interface region between these two layers.

Note that in the conventional process of forming the fuse window, the forming of the inter-metal contact via hole 42 and the fuse opening 44 were done with separate individual processes. The process of forming the fuse opening 44 was subsequently performed only after finishing a second conductive structure in the inter-metal contact via hole 42. The efforts with two sets of lithography and etching process by two masks is significantly simplified with a single patterning process as described in the present invention.

Figure 4:
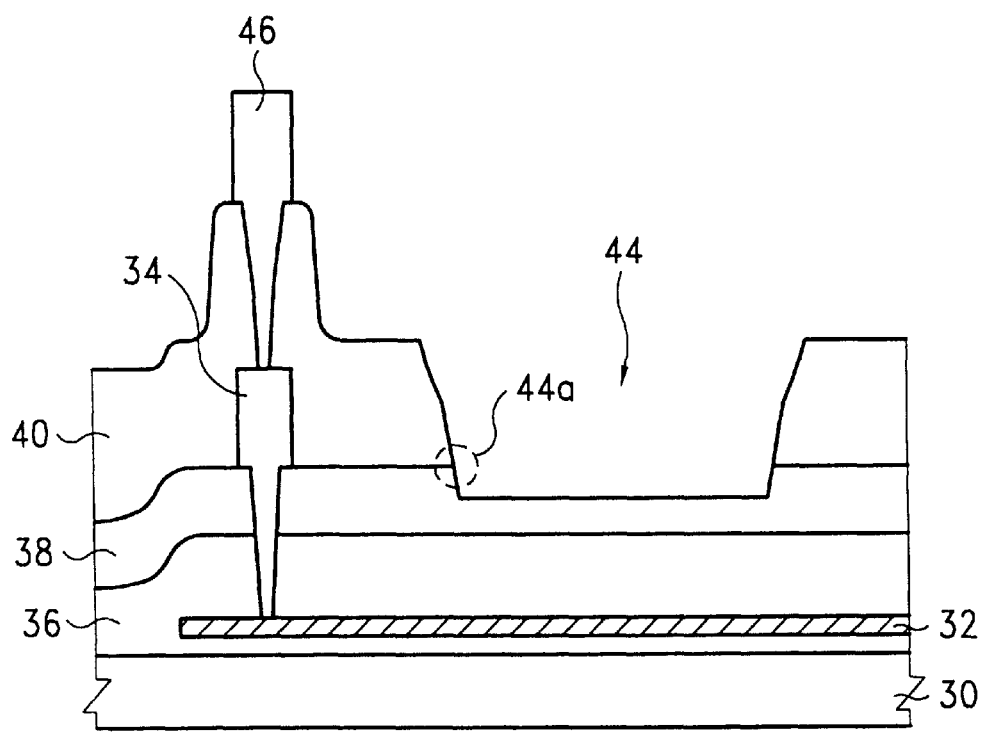
FIG. 4 illustrates a cross sectional view of forming a second conductive structure within and over the via hole in accordance with the present invention.

Turning to FIG. 4, a second conductive structure 46 is formed within and over the inter-metal contact via hole 42. In general, the second conductive structure 46 can be a single material or a combination of several conductive layers. The forming of the second conductive structure may be achieved by forming one or more conductive layers by one or more depositing or sputtering processes. The conductive layers are then patterned and etched to form the second conductive structure 46 as shown in FIG. 4.

Figure 5:
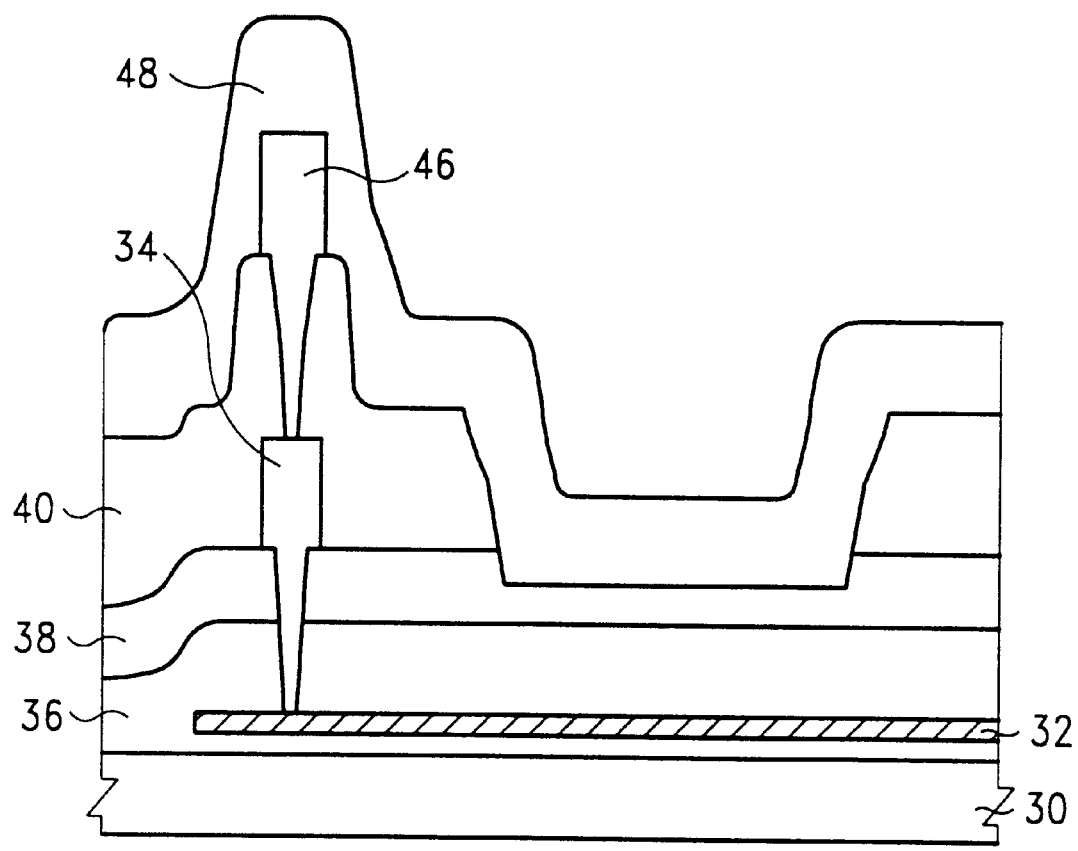
FIG. 5 illustrates a cross sectional view of forming a passivation layer over the second conductive structure and the fuse opening in accordance with the present invention.

Next, a passivation layer 48 is formed over the conductive structure 46 and the fuse opening 44, as shown in FIG. 5. The passivation layer 48 is selected from the materials with good moisture insulating characteristics. In the case, a combination of an oxide layer and a nitride layer over the oxide layer is used. The oxide layer is formed by PECVD (plasma enhanced chemical vapor deposition) with a thickness between 80 angstroms to 3,000 angstroms. The nitride layer is formed also with PECVD with a thickness of about 3,000 to 8,000 angstroms. Alternatively, a single nitride layer can be used as the passivation layer 48. A PECVD process can also be used to have a thickness of a single nitride layer between 4,000 angstroms to 8,000 angstroms.

Under the control on sidewall steepness of the fuse opening 44, the passivation layer 48 formed with an anisotropic process like PECVD can have sufficient thickness on the sidewall to prevent undesired moisture encroachment. The thickness of the passivation layer 48 on the sidewall is increased with the reduced steepness. Therefore, the interface between the dielectric layers can be well protected without the damaging effect of moisture and contamination to the inner conductive paths or devices.

Figures 6A, 6B:
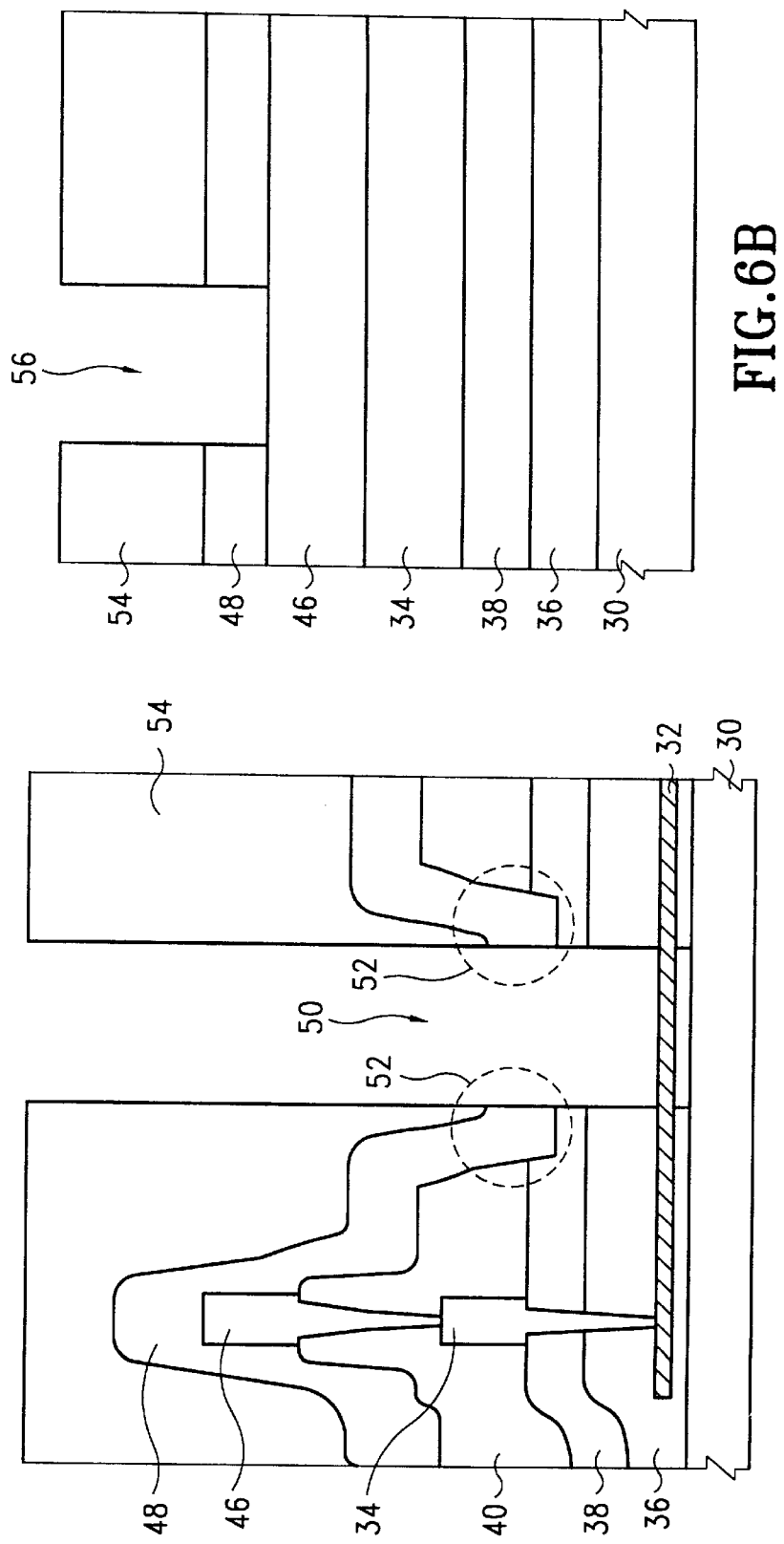
FIG. 6A illustrates a cross sectional view of removing a portion of the passivation layer and of the dielectric layers for forming the fuse window between a sidewall structure formed on the fuse opening in accordance with the present invention.
FIG. 6B illustrates a cross sectional view of forming a bonding pad opening simultaneously with the fuse window in accordance with the present invention.

Referring next to FIG. 6A, a portion of the passivation layer 48 and a portion of the dielectric layers 36, 38 and 40 are removed down to the fuse 18. A fuse window 50 is formed between a sidewall structure 52, which is formed on the sidewall of the fuse opening 44 by the passivation layer 48. A raised fuse structure 32 remains. The fuse window 50 has a narrower width than the fuse opening 44. A sidewall passivation structure 52 is formed to shield the weakest interface region 44a between the inter-layer dielectric layer 38 and the inter-metal dielectric layer 40. Thus, internal elements such as conductive structures can be protected from damage by moisture and contamination. The fuse technology can be applied with increased reliability with the sidewall passivation.

The definition of the fuse window 50 can be done with a patterning process. First, a photoresist layer 54 is formed over the passivation layer 48. A fuse window region is defined in the photoresist layer 54. An etching step is then performed to etch the passivation layer 48, the dielectric layer 38, and the oxide layer 36 by using the photoresist layer 54 as a mask. The fuse 32 acts as the etching stop for those regions of the oxide layer 36 that are underneath the fuse 32. However, preferably, for those areas of the oxide layer 36 not covered by the fuse 32, these areas are overetched to result in the structure shown in FIG. 7B. An isotropic etching is preferably used.

In the preferred embodiment, a polyimide layer is used as the photoresist layer 54. The polyimide layer 54, which also serves as a final top layer passivation, can be left on the substrate 30 for providing better protection. A thermal curing process can be performed to densify and harden the polyimide layer 54 for providing better hardness and protection.

At the same time of forming the fuse window 50, a bonding pad opening 56 can be formed, as shown in FIG. 6B. The bonding pad opening 56 to the second conductive structure 46 is formed on other locations on the substrate 30. The pattern of the bonding pad opening 56 can be defined onto the polyimide layer 54 with the same mask used in defining the fuse window 50. Thus, the additional steps in the conventional process for forming the bonding pad can be eliminated to reduce the production cost and increase the production throughput.

Figure 7A:
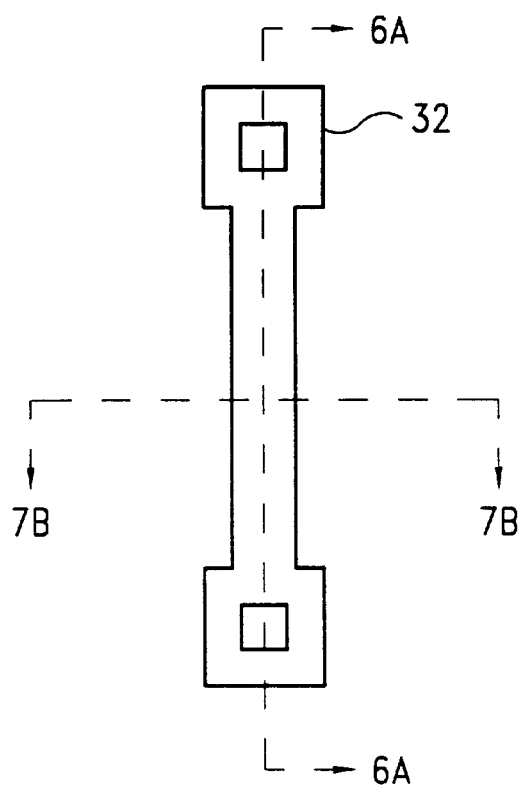
FIG. 7A illustrates a top view of a fuse structure in accordance with the present invention.
Figures 7B, 7C:
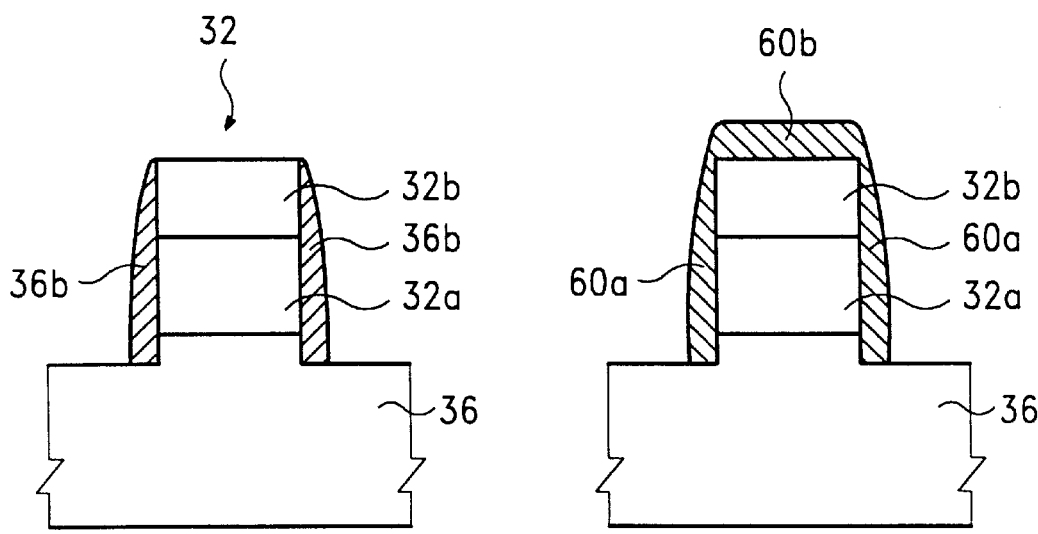
FIG. 7B illustrates a cross sectional view of a fuse structure with nitride sidewalls in a perpendicular direction of the fuse structure in accordance with the present invention.
FIG. 7C illustrates a cross sectional view of a fuse structure with a nitride cap and nitride sidewalls in a perpendicular direction of the fuse structure in accordance with the present invention.

Turning to FIG. 7A, the top view of the fuse 32 is illustrated. The cross sectional view in a perpendicular direction is illustrated in FIG. 7B. By etching down the inter-polysilicon oxide layer 36 to the fuse and under the fuse, the raised fuse structure 32 is achieved. Additionally, a thin oxide sidewall spacer structure 36b is left over the raised fuse structure 32. The laser energy required to break the fuse is greatly reduced without the covering oxide layer 36. Thus, the laser process can be performed with a low energy laser.

Referring to FIG. 7C, in the application of a self-aligned contact (SAC) process, the fuse 32 can be formed with nitride sidewalls 60a and a nitride cap 60b. In the process of etching the fuse window 50, the etching down process can be controlled to stop at the nitride sidewalls 60a and the nitride cap 60b. The etching process can also be performed to etch-off the nitride cap 60b. In the case, the fuse 32 can be composed of a ploysilicon layer 32a and a tungsten silicide layer 32b covered over. Therefore, the etching process can be controlled to left either the fuse 32 with the nitride sidewalls 60a and the nitride cap 60b, or the fuse 32 with only the nitride sidewalls 60a and an exposed surface of the tungsten silicide layer 32b.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a fuse window on a substrate with a fuse, a first conductive structure and dielectric layers, said method comprising the steps of:

removing a portion of said dielectric layers to form a contact hole within said dielectric layers extending down to said first conductive structure and to form a fuse opening within said dielectric layers over said fuse;

forming a second conductive structure within said contact hole and over said contact hole;

forming a passivation layer over said second conductive structure and said fuse opening; and removing a portion of said passivation layer and of said dielectric layers down to at least said fuse leaving a raised fuse structure within said fuse opening, said raised fuse structure between two sidewall structures formed from said passivation layer.

2. The method of claim 1, wherein said dielectric layers comprise an inter-polysilicon oxide layer, an inter-layer dielectric layer, and an inter-metal dielectric layer.

3. The method of claim 1, wherein said step of forming said contact hole and said fuse opening includes a wet etching and a dry etching.

4. The method of claim 1, wherein said fuse opening is formed across at least two layers of said dielectric layers in depth.

5. The method of claim 1, wherein said passivation layer is a nitride layer.

6. The method of claim 1, wherein said passivation layer is a combination of an oxide layer and a nitride layer.

7. The method of claim 1, wherein said step of forming said fuse window and said sidewall structure comprises the steps of:

forming a photoresist layer over said passivation layer;

defining a fuse window region in said photoresist layer; and etching said passivation layer and said dielectric layers by using said photoresist layer as a mask.

8. The method of claim 7, wherein said photoresist layer is a polyimide layer.

9. The method of claim 8 further includes the step of performing a thermal curing process after said etching step, in order to harden said polyimide layer.

10. The method of claim 1, wherein a bonding pad opening to said second conductive structure is simultaneously formed within said step of forming said raised fuse structure.

11. The method of claim 1, wherein said raised fuse structure is formed and exposed with a fuse sidewall spacer structure formed over.

12. The method of claim 1, wherein said fuse opening has an inclined angle at sidewalls between about 50 degrees to 80 degrees, said inclined angle being measured by referencing to a horizontal surface of said substrate.

13. A method of forming a fuse window on a substrate with a fuse, a first conductive structure and dielectric layers, said method comprising the steps of:

removing a portion of said dielectric layers to form a contact hole within said dielectric layers extending down to said first conductive structure and to form a fuse opening within said dielectric layers over said fuse, said fuse opening being formed across at least two layers of said dielectric layers in depth;

forming a second conductive structure within said contact hole and over said contact hole;

forming a passivation layer over said second conductive structure and said fuse opening;

forming a photoresist layer over said passivation layer;

defining a fuse window region in said photoresist layer, said fuse window region within said fuse opening; and etching said passivation layer and said dielectric layers down to at least said fuse by using said photoresist layer as a mask, leaving a raised fuse structure between two sidewall structures formed from said passivation layer.

14. The method of claim 13, wherein said dielectric layers comprise an inter-polysilicon oxide layer, an inter-layer dielectric layer, and an inter-metal dielectric layer.

15. The method of claim 13, wherein said step of forming said contact hole and said fuse opening includes a wet etching and a dry etching.

16. The method of claim 13, wherein said passivation layer is a nitride layer.

17. The method of claim 13, wherein said passivation layer is a combination of an oxide layer and a nitride layer.

18. The method of claim 13, wherein said photoresist layer is a polyimide layer.

19. The method of claim 18 further includes the step of performing a thermal curing process after said etching step, in order to harden said polyimide layer.

20. The method of claim 13, wherein a bonding pad opening to said second conductive structure is simultaneously formed within said step of forming said fuse window.

21. The method of claim 13, wherein said raised fuse structure is formed and exposed with a fuse sidewall structure formed over.

22. The method of claim 13, wherein said fuse opening has an inclined angle at sidewalls between about 50 degrees to 80 degrees, said inclined angle being measured by referencing to a horizontal surface of said substrate.

* * * * *